(12) United States Patent
Voronin et al.

(10) Patent No.: US 12,306,044 B2
(45) Date of Patent: May 20, 2025

(54) OPTICAL EMISSION SPECTROSCOPY FOR ADVANCED PROCESS CHARACTERIZATION

(71) Applicant: Tokyo Electron Limited, Tokyo (JP)

(72) Inventors: Sergey Voronin, Albany, NY (US); Blaze Messer, Albany, NY (US); Yan Chen, Fremont, CA (US); Joel Ng, Fremont, CA (US); Ashawaraya Shalini, Fremont, CA (US); Ying Zhu, Fremont, CA (US); Da Song, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 208 days.

(21) Appl. No.: 17/948,407

(22) Filed: Sep. 20, 2022

(65) Prior Publication Data

US 2024/0094056 A1 Mar. 21, 2024

(51) Int. Cl.
*G01J 3/443* (2006.01)
*H01J 37/32* (2006.01)

(52) U.S. Cl.
CPC ......... *G01J 3/443* (2013.01); *H01J 37/32146* (2013.01); *H01J 37/32972* (2013.01); *H01J 2237/24485* (2013.01); *H01J 2237/24507* (2013.01); *H01J 2237/24585* (2013.01); *H01J 2237/334* (2013.01)

(58) Field of Classification Search
CPC .............. G01J 3/443; H01J 37/32146; H01J 2237/24485; H01J 2237/24507; H01J 2237/24585; H01J 2237/334
See application file for complete search history.

(56) References Cited

U.S. PATENT DOCUMENTS

| 3,059,611 | A | 10/1962 | Fury et al. |
| 3,612,692 | A | 10/1971 | Kruppa et al. |
| 4,147,435 | A | 4/1979 | Habegger |
| 5,014,217 | A | 5/1991 | Savage |
| 5,308,414 | A | 5/1994 | O'Neill et al. |

(Continued)

FOREIGN PATENT DOCUMENTS

| CN | 1482578 A | 3/2004 |
| CN | 101038860 A | 9/2007 |

(Continued)

OTHER PUBLICATIONS

International Search Report and Written Opinion, PCT Application No. PCT/US2023/029879, mailed Nov. 22, 2023, 10 pages.

(Continued)

*Primary Examiner* — Nicole M Ippolito
*Assistant Examiner* — Hanway Chang
(74) *Attorney, Agent, or Firm* — Slater Matsil, LLP (57) ABSTRACT

A method of characterizing a plasma in a plasma processing system that includes: generating a pulsed plasma in a plasma processing chamber of the plasma processing system, the pulsed plasma being powered with a pulsed power signal, each pulse of the pulsed plasma including three periods: a overshoot period, a stable-ON period, and a decay period; performing cyclic optical emission spectroscopy (OES) measurements for the pulsed plasma, the cyclic OES measurements including: obtaining first OES data during one of the three periods from more than one pulses of the pulsed plasma; and obtaining a characteristic of the pulsed plasma for the one of the three periods based only on the first OES data.

20 Claims, 9 Drawing Sheets

(56) References Cited

U.S. PATENT DOCUMENTS

| | | | |
|---|---|---|---|
| 5,347,460 A | 9/1994 | Gifford et al. |
| 5,353,790 A | 10/1994 | Jacques et al. |
| 5,450,205 A | 9/1995 | Sawin et al. |
| 5,517,312 A | 5/1996 | Finarov |
| 5,648,198 A | 7/1997 | Shibata |
| 5,658,423 A | 8/1997 | Angell et al. |
| 5,751,416 A | 5/1998 | Singh et al. |
| 5,807,761 A | 9/1998 | Coronel et al. |
| 5,885,472 A | 3/1999 | Miyazaki et al. |
| 5,980,767 A | 11/1999 | Koshimizu et al. |
| 6,060,328 A | 5/2000 | En et al. |
| 6,081,334 A | 6/2000 | Grimbergen et al. |
| 6,090,302 A | 7/2000 | Smith, Jr. et al. |
| 6,132,577 A | 10/2000 | Smith, Jr. et al. |
| 6,374,832 B2 | 4/2002 | Chow et al. |
| 6,381,008 B1 | 4/2002 | Branagh et al. |
| 6,535,779 B1 | 3/2003 | Birang et al. |
| 6,564,114 B1 | 5/2003 | Toprac et al. |
| 6,582,618 B1 | 6/2003 | Toprac et al. |
| 6,673,200 B1 | 1/2004 | Gu et al. |
| 6,703,250 B2 | 3/2004 | Chiu |
| 6,745,095 B1 | 6/2004 | Ben-Dov et al. |
| 6,815,653 B2 | 11/2004 | Tsay et al. |
| 6,825,920 B2 | 11/2004 | Lam et al. |
| 6,830,939 B2 | 12/2004 | Harvey et al. |
| 6,911,157 B2 | 6/2005 | Edamura et al. |
| 6,952,657 B2 | 10/2005 | Jahns et al. |
| 6,958,484 B2 | 10/2005 | Mitrovic |
| 6,969,619 B1 | 11/2005 | Winniczek |
| 7,030,335 B2 | 4/2006 | Hoffman et al. |
| 7,241,397 B2 | 7/2007 | Fink et al. |
| 7,312,865 B2 | 12/2007 | Chen |
| 7,328,126 B2 | 2/2008 | Chamness |
| 7,334,477 B1 | 2/2008 | Pirkle |
| 7,403,930 B2 | 7/2008 | Ho |
| 7,591,923 B2 | 9/2009 | Mitrovic et al. |
| 7,906,032 B2 | 3/2011 | Yamashita |
| 7,959,970 B2 | 6/2011 | Gaudet et al. |
| 8,048,326 B2 | 11/2011 | Yue et al. |
| 8,154,721 B2 | 4/2012 | Chen et al. |
| 8,158,017 B2 | 4/2012 | Hudson |
| 8,173,451 B1 | 5/2012 | Tian et al. |
| 8,415,884 B2 | 4/2013 | Chen et al. |
| 8,416,509 B2 | 4/2013 | Yi et al. |
| 8,486,290 B2 | 7/2013 | Morisawa et al. |
| 8,513,583 B2 | 8/2013 | Corke et al. |
| 8,553,218 B2 | 10/2013 | Tinnemans et al. |
| 8,877,080 B2 | 11/2014 | Chen et al. |
| 8,883,024 B2 | 11/2014 | Chen et al. |
| 9,200,950 B2 | 12/2015 | Lian et al. |
| 9,209,950 B2 | 12/2015 | Luo et al. |
| 9,330,990 B2 | 5/2016 | Chen et al. |
| 9,760,008 B2 | 9/2017 | Devilliers |
| 9,842,726 B2 | 12/2017 | Daniels et al. |
| 9,899,278 B2 | 2/2018 | Ishikawa |
| 10,436,717 B2 | 10/2019 | Omstead et al. |
| 10,453,653 B2 | 10/2019 | Chen et al. |
| 10,692,705 B2 | 6/2020 | Mihaylov et al. |
| 2001/0046769 A1 | 11/2001 | Chow et al. |
| 2002/0029851 A1 | 3/2002 | Edamura et al. |
| 2003/0005943 A1 | 1/2003 | Singh et al. |
| 2003/0132195 A1 | 7/2003 | Edamura et al. |
| 2004/0008336 A1 | 1/2004 | Lam et al. |
| 2004/0026035 A1 | 2/2004 | Mitrovic |
| 2004/0058359 A1 | 3/2004 | Mei et al. |
| 2004/0104681 A1 | 6/2004 | Mitrovic et al. |
| 2004/0235303 A1 | 11/2004 | Wong et al. |
| 2005/0241669 A1 | 11/2005 | Wodecki |
| 2006/0006139 A1 | 1/2006 | Johnson |
| 2006/0285108 A1 | 12/2006 | Morrisroe |
| 2007/0128876 A1 | 6/2007 | Fukiage |
| 2007/0238199 A1 | 10/2007 | Yamashita |
| 2008/0186473 A1 | 8/2008 | Lee |
| 2008/0285202 A1 | 11/2008 | Boyd et al. |
| 2009/0029489 A1 | 1/2009 | Park et al. |
| 2009/0065025 A1 | 3/2009 | Urbanowicz et al. |
| 2009/0280581 A1 | 11/2009 | Hudson |
| 2009/0325387 A1 | 12/2009 | Chen et al. |
| 2010/0081285 A1 | 4/2010 | Chen et al. |
| 2011/0139748 A1 | 6/2011 | Donnelly et al. |
| 2011/0174776 A1 | 7/2011 | Kabe et al. |
| 2012/0006351 A1 | 1/2012 | Jun et al. |
| 2012/0085494 A1 | 4/2012 | Uchida et al. |
| 2012/0091097 A1 | 4/2012 | Chen et al. |
| 2012/0101622 A1 | 4/2012 | Yun et al. |
| 2012/0175060 A1 | 7/2012 | Hudson et al. |
| 2013/0016344 A1 | 1/2013 | Bullock et al. |
| 2013/0141720 A1 | 6/2013 | Park et al. |
| 2014/0097359 A1 | 4/2014 | Vasic et al. |
| 2014/0106477 A1 | 4/2014 | Chen et al. |
| 2014/0209453 A1 | 7/2014 | Jun et al. |
| 2015/0004721 A1 | 1/2015 | Akimoto et al. |
| 2015/0069912 A1 | 3/2015 | Valcore, Jr. et al. |
| 2015/0160557 A1 | 6/2015 | deVilliers |
| 2015/0241272 A1 | 8/2015 | Lian et al. |
| 2016/0131587 A1 | 5/2016 | Meloni et al. |
| 2016/0233135 A1 | 8/2016 | Ishikawa |
| 2016/0268108 A1 | 9/2016 | Daniels et al. |
| 2016/0314943 A1 | 10/2016 | Albarede et al. |

FOREIGN PATENT DOCUMENTS

| | | |
|---|---|---|
| CN | 101221891 A | 7/2008 |
| CN | 102788916 A | 11/2012 |
| CN | 102282654 B | 10/2013 |
| CN | 103117202 B | 9/2015 |
| EP | 0756318 A1 | 1/1997 |
| EP | 0652415 B1 | 12/1998 |
| JP | H05226296 A | 9/1993 |
| JP | H08106992 A | 4/1996 |
| JP | H09266097 A | 10/1997 |
| JP | 2005527984 A | 9/2005 |
| JP | 2009064814 A | 3/2009 |
| JP | 2015532544 A | 11/2015 |
| JP | 2016146384 A | 8/2016 |
| JP | 2016541119 A | 12/2016 |
| KR | 20120126418 A | 11/2012 |
| KR | 102383416 B1 | 4/2022 |
| TW | 589659 B | 6/2004 |
| TW | 201435621 A | 9/2014 |
| WO | 02091453 A1 | 11/2002 |
| WO | 2005111265 A1 | 11/2005 |
| WO | 2015130433 A1 | 9/2015 |

OTHER PUBLICATIONS

De Schepper et al. "Pattern Roughness Mitigation of 22 nm Lines and Spaces: The Impact of a H2 Plasma Treatment Plasma Processes and Polymers", Sep. 2014, 10 pages.

Economou, "Pulsed plasma etching for semiconductor manufacturing", Journal of Physics D: Appl Physics, vol. 47, 303001, Jul. 1, 2014, 27 pages.

Goodlin, "Multivariate Endpoint Detection of Plasma Etching Processes" Dissertation presented Apr. 2002, at Massachusetts Institute of Technology, pp. 1-226.

Goodlin et al. "Quantitative Analysis and Comparison of Endpoint Detection Based on Multiple Wavelength Analysis" 201st Meeting of the Electrochemical Society, International Symposium on Plasma Processing XIV, Abs. 415, May 2002, pp. 1-30.

Lee, Master's Thesis presented at University of California, Berkeley, Jul. 1, 2000, 69 pages.

Park et al. "Electron characterization in weakly ionized collisional plasmas: from principles to techniques", Advances in Physics, vol. 4, No. 1, 1526114, Oct. 23, 2018, 53 pages.

Selwyn, "Optical Diagnostic Techniques for Plasma Processing" AVS Press, 1993, Relevant chapter 3 on Optical Emission Spectroscopy (OES) is provided, pp. 26-80 with title and bibliographic information pages.

Shannon et al. "A Spatially Resolved Optical Emission Sensor Plasma Etch Monitoring" Appl. Phys. Lett., vol. 71 No. 11, Sep. 1997, pp. 1467-1468.

(56) References Cited

OTHER PUBLICATIONS

Ventzek et al. "Formation, Nature, and Stability of the Arsenic-Silicon-Oxygen Alloy for Plasma Doping of Non-Planar Silicon Structures" Applied Physics letters, vol. 105, Dec. 30, 2014, pp. 262102-1-262102.

White, "Multivariate Analysis of Spectral Measurements for the Characterization of Semiconductor Processes" Dissertation presented Apr. 2002, at Massachusetts Institute of Technology, pp. 1-357.

White et al. "Low-Open Area Endpoint Detection using a PCA based T2 Statistic and Q Statistic on Optical Emission Spectroscopy Measurements" IEEE Transactions on Semiconductor Manufacturing, vol. 13 No. 2, May 2000, pp. 1-30.

Yamaguchi et al. "Direct current superposed dual-frequency capacitively coupled plasmas in selective etching of SiOCH over SiC", Journal of Physics D Applied Physics, Dec. 2011, 25 pages.

Yue et al. "Plasma Etching Endpoint Detection Using Multiple Wavelengths for Small Open-Area Wafers" J. Vac. Sci. Technol. A, vol. 19 No. 1, Jan./Feb., 2001, pp. 66-75.

OPTICAL EMISSION SPECTROSCOPY FOR ADVANCED PROCESS CHARACTERIZATION

TECHNICAL FIELD

The present invention relates generally to systems and methods of process characterization, and, in particular embodiments, to optical emission spectroscopy for advanced process characterization.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

Advanced process control that involves in-situ process characterization and fault detection in semiconductor manufacturing is essential for reproducible production of complex structures. As the minimum dimension of features in a patterned layer has shrunk periodically and new materials have been introduced in ICs, the need for improved process characterization to assure process compliance and cost reduction has increased.

SUMMARY

In accordance with an embodiment of the present invention, a method of characterizing a plasma in a plasma processing system that includes: generating a pulsed plasma in a plasma processing chamber of the plasma processing system, the pulsed plasma being powered with a pulsed power signal, each pulse of the pulsed plasma including three periods: a overshoot period, a stable-ON period, and a decay period; performing cyclic optical emission spectroscopy (OES) measurements for the pulsed plasma, the cyclic OES measurements including: obtaining first OES data during one of the three periods from more than one pulses of the pulsed plasma; and obtaining a characteristic of the pulsed plasma for the one of the three periods based only on the first OES data.

In accordance with an embodiment of the present invention, a method of processing a substrate that includes: performing a plasma process on a substrate in a plasma processing chamber by exposing the substrate to a pulsed plasma in the plasma processing chamber, the pulsed plasma being provided with a source power and a pulsed bias power at a bias power frequency; and repeatedly obtaining first optical emission spectroscopy (OES) data when the bias power is OFF and the source power is provided, where the first OES data being obtained at the bias power frequency.

In accordance with an embodiment of the present invention, an optical emission spectroscopy (OES) apparatus including: a plasma processing chamber configured to hold a substrate to be processed; a RF power source configured to generate a pulsed plasma in the plasma processing chamber; an OES detection device connected to the plasma processing chamber, the OES detection device being configured to measure OES signals from the pulsed plasma; a microprocessor; and a non-transitory memory storing a program to be executed in the microprocessor, the program including instructions to: generate a first pulse train and a second pulse train, the first pulse train and the second pulse train being synchronized; power the RF power source and generate the pulsed plasma based on the first pulse train; and collect a set of OES data at the OES detection device based on the second pulse train.

BRIEF DESCRIPTION OF THE DRAWINGS

For a more complete understanding of the present invention, and the advantages thereof, reference is now made to the following descriptions taken in conjunction with the accompanying drawings, in which:

FIG. 6A-6B illustrates example schemes for OES data acquisition synchronized with power pulsing for a pulsed plasma in accordance with various embodiments, wherein FIG. 7A-7C illustrates process flow charts of methods of characterizing a pulsed plasma with OES in accordance with various embodiments, wherein FIG. 7A illustrates an embodiment.

DETAILED DESCRIPTION OF ILLUSTRATIVE EMBODIMENTS

This application relates to systems and methods of process characterization, more particularly to optical emission spectroscopy (OES) for advanced process characterization. In semiconductor manufacturing, plasma processing is used at various stages for depositing and etching various materials to construct complex structures with precision at nanometer scale. Because a plasma is a highly energetic and complex system comprising ion and radical species, it is often challenging to accurately characterize the plasma during operation and monitor the progress of a plasma process. Optical emission spectroscopy (OES) is a powerful spectroscopic tool to analyze atoms and ions present in a plasma by detecting optical emission from excited species, and OES systems have been incorporated to some plasma processing systems for process characterization as described in, for example, in U.S. Pat. Nos. 5,862,060 and 10,453,653. For example, using OES to collect light emission signal from process plasmas, endpoint detection (EPD) of a plasma etch process such as reactive ion etching (RIE) and atomic layer etching (ALE) may be achieved. However, in many cases, time resolution of OES methods during plasma processing has been limited to sub-second scale and this limitation poses a significant challenge in advanced process characterization by OES. In particular, a new OES method with improved time resolution may be desired in pulsed plasma processes with power modulation, where current OES methods tend to miss important information on power modulation pulse stability due to insufficient sensitivity. Conventional OES methods may typically be based on continuous (time-averaged) signal acquisition without time synchronization with RF generators. Embodiments of the present application disclose methods that employ time synchronization of the OES data acquisition with pulsed RF generators. In various embodiments, this synchronization enables collecting the OES data only during a selected time period of interest during power modulation (e.g., only a part of a source-power-ON period). This technique advantageously allows selective OES signal observation and characterization in different phases of interest within one modulation pulse cycle and may extend the time resolution to millisecond or sub-millisecond scale. Accordingly, the methods may improve the capability of plasma stability monitoring during various advanced pulsed technology (APT) processes. In addition, separately collecting OES data from different periods by the methods may also eliminate the step of averaging signals over the different periods during power modulation, which may lead to improved signal-to-noise ratio of the OES signals.

In the following, a scheme for synchronizing optical emission spectroscopy (OES) with power modulation of a plasma is first described referring to FIG. 1, followed by an example plasma processing system in FIG. 2 and OES detection device in FIG. 3. An example RF pulsing schemes for source and bias powers in FIG. 4. Example profiles of radical density, electron density, and electron temperature of a pulsed plasma as a result of power modulation are then described referring to FIG. 5. Example schemes for OES data acquisition synchronized with power pulsing for a pulsed plasma are then described referring to FIG. 6A-6B. Example process flow diagrams are illustrated in FIG. 7A-7C. All figures in this disclosure are drawn for illustration purpose only and not to scale.

Figure 1:
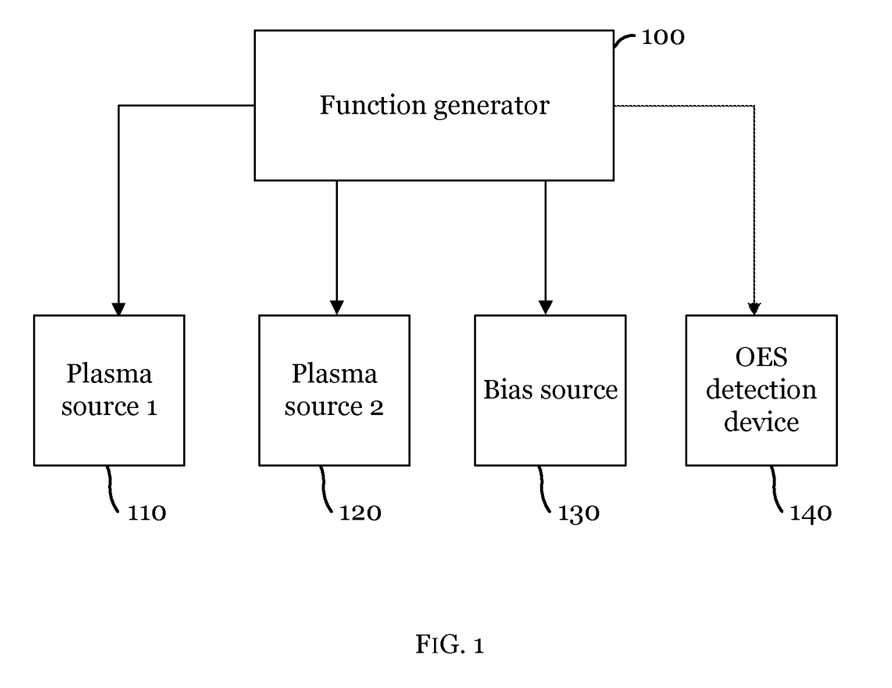
FIG. 1 illustrates a schematic block diagram of method of synchronizing an optical emission spectroscopy (OES) with plasma power modulation in accordance with various embodiments.

FIG. 1 illustrates a schematic block diagram of a method of synchronizing an optical emission spectroscopy (OES) with plasma power modulation in accordance with various embodiments.

In order to enable synchronization of OES data acquisition with pulsed plasma processing, a function generator 100 may be used to generate a set of synchronized commands for both a plasma processing unit (e.g., plasma power sources 110 and 112, and bias power source 130) and an OES detection device 140. In the following, an example implementation of the function generator 100 and the OES detection device 140 in a plasma processing system is described referring to FIG. 2. The schematic block diagram of FIG. 1 is for example only, and the number of power sources, either plasma power source or bias power source, is not limited to any number.

Figure 2:
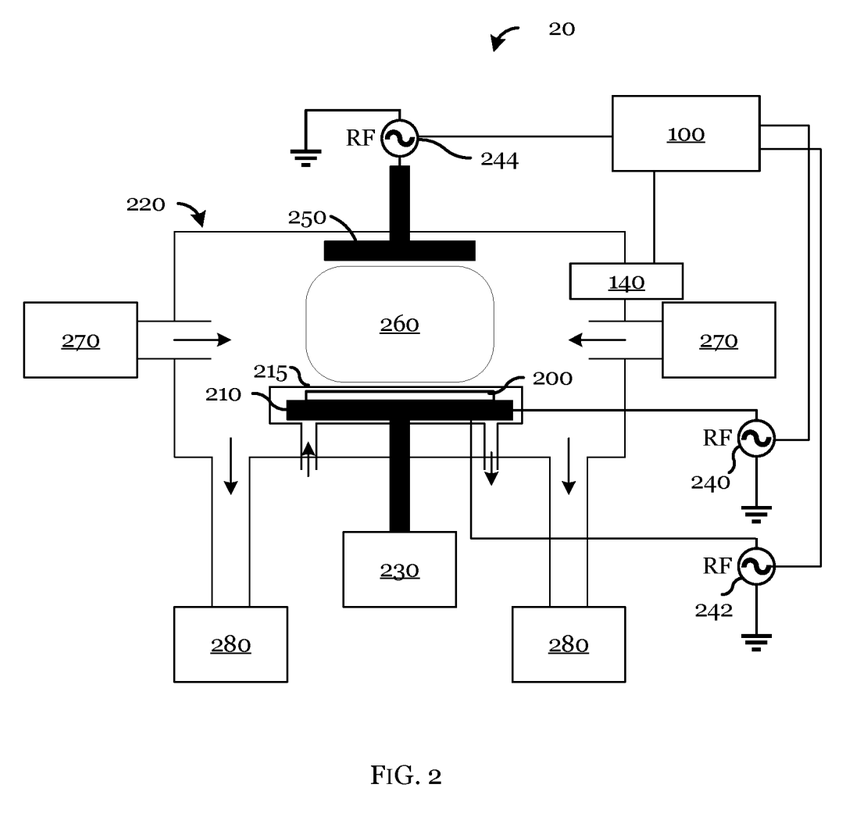
FIG. 2 illustrates an example plasma processing system with an OES configured to operate in synchronization with plasma processing in accordance with various embodiments.

FIG. 2 illustrates an example plasma processing system 20 with an OES configured to operate in synchronization with plasma processing in accordance with various embodiments.

For illustrative purposes, FIG. 2 illustrates a substrate 200 placed on a substrate holder 210 (e.g., a circular electrostatic chuck (ESC)) inside a plasma processing chamber 220 near the bottom. The substrate 200 may be optionally maintained at a desired temperature using a heater/cooler 215 that surrounds the substrate holder 210. The temperature of the substrate 200 may be maintained by a temperature controller 230 connected to the substrate holder 210 and the heater/cooler 215. The ESC may be coated with a conductive material (e.g., a carbon-based or metal-nitride based coating) so that electrical connections may be made to the substrate holder 210.

Process gases may be introduced into the plasma processing chamber 220 by a gas delivery system 270. The gas delivery system 270 comprises multiple gas flow controllers to control the flow of multiple gases into the chamber. Each of the gas flow controllers of the gas delivery system 270 may be assigned for each of fluorocarbons, noble gases, and/or balancing agents. In some embodiments, optional center/edge splitters may be used to independently adjust the gas flow rates at the center and edge of the substrate 200. The process gases or any exhaust gases may be evacuated from the plasma processing chamber 220 using vacuum pumps 280.

As illustrated in FIG. 2, the substrate holder 210 may be a bottom electrode of the plasma processing chamber 220. In the illustrative example in FIG. 2, the substrate holder 210 is connected to two RF power sources, 240 and 242. In some embodiment, a conductive circular plate inside the plasma processing chamber 220 near the top is the top electrode 250. In FIG. 2, the top electrode 250 is connected to another RF power source 244 of the plasma processing system 20. The three RF power sources 240, 242, and 244 may corresponds to the bias power source 130, the plasma power sources 110 and 120 illustrated in FIG. 1. In various embodiments, all of power sources for plasma processing (e.g., RF power sources 240, 242, and 244) are connected to a function generator 100 to enable a synchronized operation of the power sources. Further, the function generator 100 is also connected to an OES detection device 140. The OES detection device 140 may be disposed at a position to measure the optical emission from the processing region of a plasma 260 between the substrate 200 and the top electrode 250.

In various embodiments, the function generator 100 comprises an appropriate digital and/or analog circuitry such as oscillators, pulse generators, modulators, combiners, and the like. The function generator may be a part of, or include, a controller unit for the plasma processing system 20 that enables feedback control of a plasma process, for example, based on a process monitoring using the OES methods. The function generator 100 is capable of generating one or more arbitrary waveforms that may be used for both power modulation of the RF power sources and OES data acquisition. In certain embodiments, some of the power modulation may be performed by the RF power sources themselves instead of the function generator. In such cases, the function generator 100 may generate a pulse train synchronized with the power modulation by the RF power sources for OES data acquisition. In certain embodiments, although not illustrated, additional components (e.g., a broadband amplifier and a broadband impedance matching network) may be connected to the RF power sources.

In certain embodiments, power sources may comprise a DC power source. The RF and/or DC power sources (e.g., the RF power sources 240, 242, and 244) may be configured to generate a continuous wave (CW) RF, pulsed RF, DC, pulsed DC, a high frequency rectangular (e.g., square wave) or triangular (e.g., sawtooth) pulse train, or a combination or superposition of more than one such waveform. In addition, power sources may be configured to generate a periodic function, for example, a sinusoid whose characteristics such as amplitude and frequency may be adjusted during a plasma process.

A typical frequency for the RF source power can range from about 0.1 MHz to about 6 GHz. In certain embodiments, the RF power sources 242 and 244 may be used to provide a low frequency RF power and a high frequency RF power at the same time, respectively.

In this disclosure, the methods of OES are primarily directed to characterization of a pulsed plasma process. The pulsed plasma in this disclosure refers to any type of plasma where a source power, a bias power, or both is pulsed at any frequency. In various embodiments, a pulsing at a frequency between 0.1 kHz and 100 kHz may be used to modulate the plasma source power or the bias power. In certain embodiments, a RF pulsing at a kHz range may be used to power the plasma. In various embodiments, any duty ratio (e.g., 0.1% to 99.9%) may be used for any plasma tool. In certain embodiments, a moderate duty ratio between 10% to 70% or 10% to 80% may be used for capacitively coupled plasma (CCP), and 3% to 90% for inductively coupled plasma (ICP). In one embodiment, a sinusoidal RF signal of 1 MHz may be modulated with an on-off frequency of 100 Hz. In another embodiment, a DC signal may be modulated with an on-off frequency of 100 Hz. In yet another embodiment, a square DC pulse signal of 1 MHz may be modulated with an on-off frequency of 100 Hz. In an alternate embodiment, cyclic modulation of RF or fast DC pulse waveform may be performed at a lower frequency (e.g., <100 Hz) using an algorithm.

In a RF pulsed plasma, various parameters such as radical density, electron density, and electron temperature may rapidly change in response to power modulation, and their temporal profile may not be sufficiently analyzed using time-averaged, non-synchronized in time methods of OES data collection adopted to plasma process characterization. In various embodiments, the methods described in this disclosure may use the function generator 100 to synchronize the power modulation for the plasma control with the OES data acquisition so that OES spectra may be selectively obtained for a portion of one pulse cycle during the power modulation.

Various configurations may be used for a plasma processing system 20 that is equipped with the OES detection device 140. For example, the plasma processing system 20 may be a capacitively coupled plasma (CCP) system, as illustrated in FIG. 2, or an inductively coupled plasma (ICP) plasma system. In alternate embodiments, the plasma processing system 20 may comprise a resonator such as a helical resonator. Further, microwave plasma (MW) or other suitable systems may also be used. In various embodiments, the RF power, chamber pressure, substrate temperature, gas flow rates and other plasma process parameters may be selected in accordance with the respective process recipe.

Figure 3:
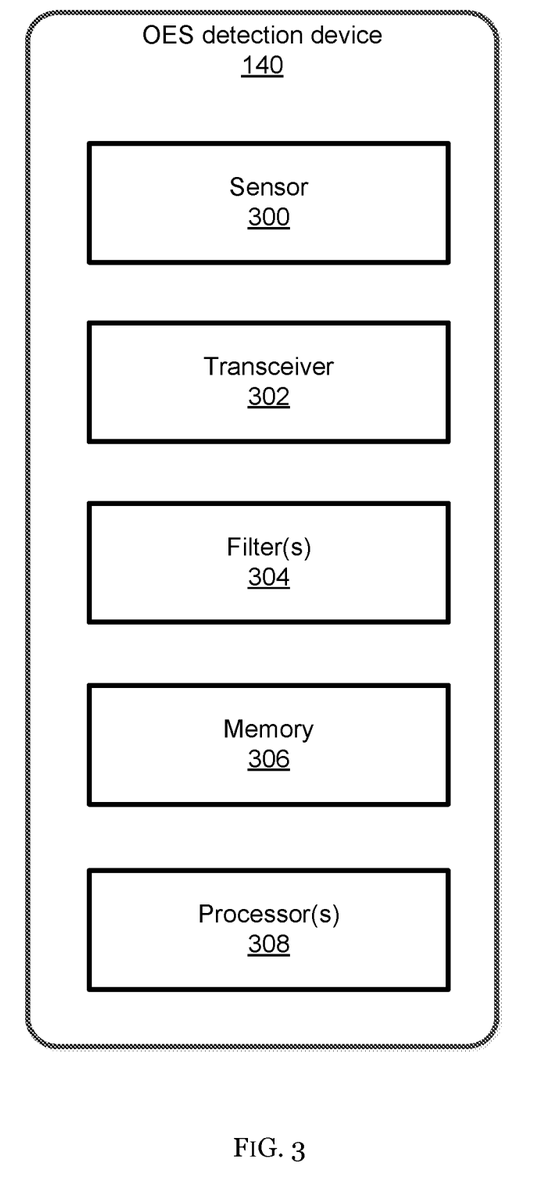
FIG. 3 illustrates a schematic diagram of an OES detection device and their components in accordance with various embodiments.

FIG. 3 illustrates a schematic diagram of an OES detection device 140 and their components in accordance with various embodiments.

The OES detection device 140 may comprise a sensor 300, a transceiver 302, a filter 304, a memory 306, and a processor 308. In various embodiments, the OES detection device 140 may be configured to receive a command from the function generator 100 (FIGS. 1 and 2) and perform a series of operations accordingly: OES data acquisition at the sensor, receiving the OES data at the transceiver 302, filtering the OES data at the filter 304, and determining a characteristic of the pulsed plasma at the processor 308. The characteristic of the pulsed plasma may, for example, be plasma density, and/or concentrations of reactive ion species, etch by-product, or other species of interest. The characteristic of the pulsed plasma may also include information on electron temperature. In certain embodiments, the OES detection device 140 may be further configured to process the obtained OES data by, for example, averaging and/or smoothing prior to determining the characteristic of the pulsed plasma.

In acquiring the OES data, the sensor 300 may include, for example, a spectrometer that samples an optical emission spectrum of a plasma. The spectrum, in this example, may include light intensity as a function of wavelength or frequency. The sensor 300 may comprise a charge-coupled device (CCD) sensor, a complementary metal oxide semiconductor (CMOS) image sensor, or other type of light detection device or photosensor may be utilized to measure the light intensity at a plasma processing chamber of the plasma processing system 20. In certain embodiments, the sensor 300 may comprise a CCD sensor with a capability of millisecond time resolution. In another embodiment, the sensor 300 may comprise a CMOS image sensor with a capability of microsecond time resolution.

In various embodiments, the memory 306 may comprise a non-statutory computer-readable storage media for storing instructions which are executed by the processor 208 to perform the various functions described herein. For example, the memory 206 may generally include both volatile memory and non-volatile memory (e.g., RAM, ROM, or the like). The memory 306 may be referred to as memory or computer-readable storage media herein. The memory 306 is capable of storing computer-readable, processor-executable program instructions as computer program code that may be executed by the processor(s) 308 as a particular machine configured for carrying out the operations and functions described in the implementations herein.

The OES detection device 140 is capable of collecting a plurality of wavelengths of optical emission spectra emanating from the glow discharge of gases in the plasma processing chamber. These wavelengths can be associated with the specific chemical species generated from entering reactant gases, can result from gas phase reactions as well as reactions on the wafer and chamber surfaces. The OES detection device 140 may be configured to detect various chemical species including halides of silicon and the halogen species itself (e.g. Cl, F, Br). In certain embodiments, the plasma process may comprise etching of silicon oxide using a fluorine-containing chemistry, such as a fluorocarbon or hydrofluorocarbon gas. In such embodiments, it is useful to dynamically detect halides of silicon and the halogen species (F) that are released by the decomposition of the fluorocarbon or hydrofluorocarbon gas in order to monitor the etch process for its process and stability. Other detectable byproducts may include carbon monoxide (CO), and carbon dioxide ($CO_2$), formed by reaction of oxygen (O) from a film or gas mixture with carbon (C) from the fluorocarbon or hydrofluorocarbon gas.

The wavelengths of the optical emission spectra can also shift as the surface composition of the wafer shifts from a steady-state etch to the complete removal of the etched material. Detection of this shift may provide useful information about the plasma process, for example, for etch endpoint determination, indicating the completion of the required etch.

In various embodiments, the configuration of the OES detection device 140 may be particularly arranged for the type of plasma discharge typically used in the plasma processing system 20. For example, a range of species and wavelengths for detection may be different for high-density ICP, low-density CCP, electron cyclotron resonance (ECR) plasma, and others.

Figure 4:
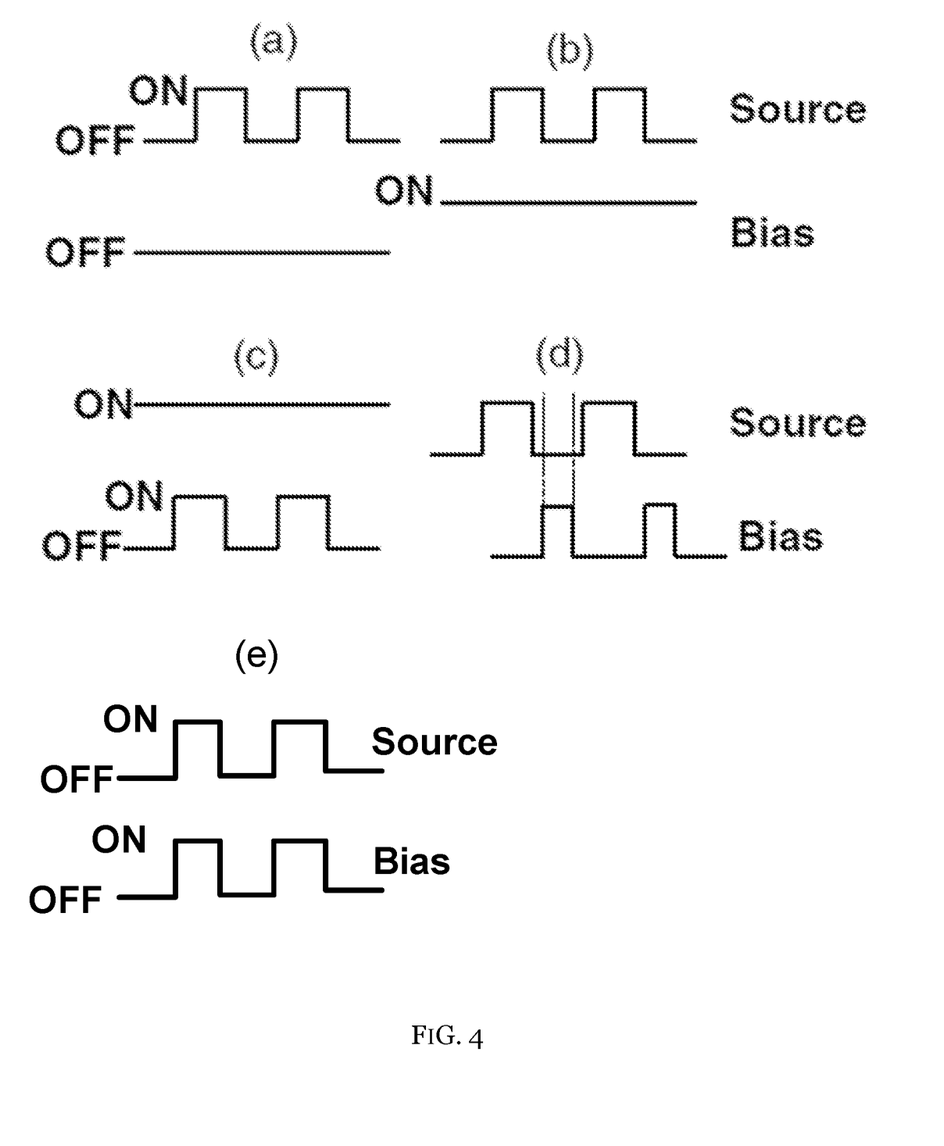
FIG. 4 illustrates example pulsing schemes for generating a pulsed plasma in accordance with various embodiments.

FIG. 4 illustrates example pulsing schemes for generating a pulsed plasma in accordance with various embodiments.

Various pulsing schemes may be used for a plasma process that is to be characterized by the OES methods. Exemplary embodiments are illustrated in FIG. 4: (a) a source power pulsed with a pulse train without a bias power (source pulsing); (b) a source power pulsed with a pulse train with a constant bias power (source pulsing); (c) a constant source power with a bias power pulsed with a pulse train (bias pulsing); (d) a source power pulsed with a first pulse train with a bias power pulsed with a second pulse train that is off-set from the first pulse train (sync pulsing with off-set); and (e) a source power pulsed with a first pulse train with a bias power pulsed with a second pulse train that is identical to the first pulse train (sync pulsing without off-set). These are only examples and other pulsing schemes may be possible in other embodiments. Further, the plasma process may have a power modulation that comprises any combination of these schemes or others, thereby having more than two distinct stages for each pulse cycle. While the examples in FIG. 4 illustrates the pulse trains as only switching between ON and OFF states, in one or more embodiments, the pulse train for the source or bias power may instead switch between two ON states: a high power level and a low power level. Further, in alternate embodiments, the pulse train may comprise more than two power levels (e.g., two ON states and OFF states).

Figure 5:
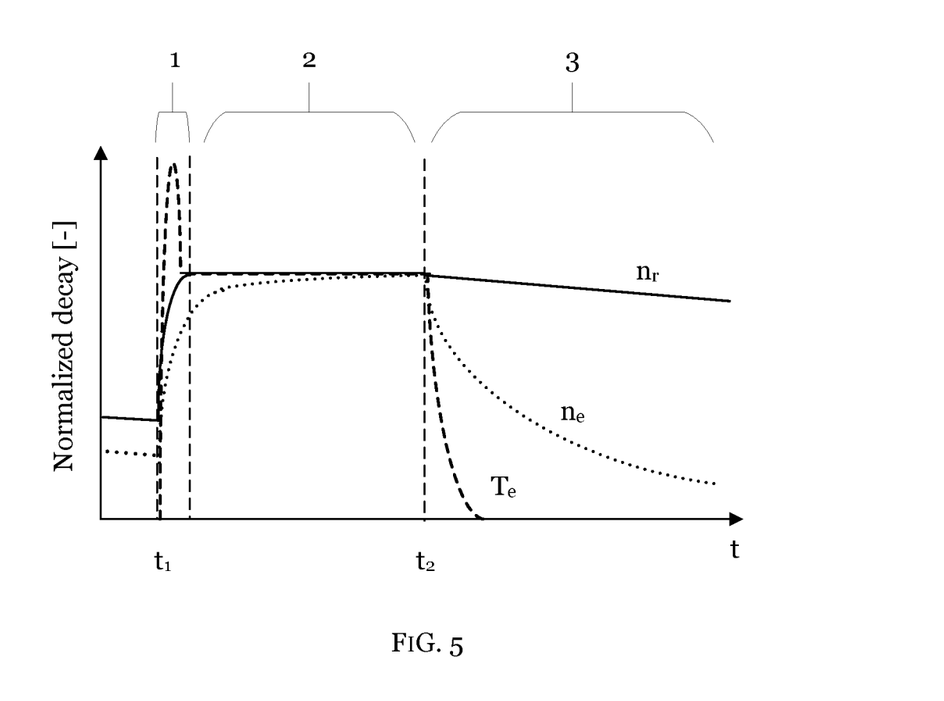
FIG. 5 illustrates temporal profiles modeled for radical density, electron density, and electron temperature of a pulsed plasma in accordance with various embodiments.

FIG. 5 illustrates temporal profiles modeled for radical density, electron density, and electron temperature of a pulsed plasma in accordance with various embodiments.

In response to pulsing powers for a plasma, the parameters of the pulsed plasma rapidly change with time. In FIG. 5, some example temporal normalized decay profiles for radical density ($n_r$), electron density ($n_e$), and electron temperature ($T_e$) for a portion of one pulse in case of source pulsing with no bias power are illustrated. In this example, the source power is turned ON at $t_1$ and OFF at $t_2$. The temporal profiles have three periods in FIG. 5: a overshoot period 1, a stable-ON period 2, and a decay period 3. First, in response to providing a sufficient source power at $t_1$, a plasma may be generated in a plasma processing chamber provided that appropriate gases are flowed under an appropriate pressure. The overshoot period 1 is an initial short transitory period, which indicates a rapid change from plasma OFF state to ON state before the plasma becomes stable. During this period, as illustrated in FIG. 5, the electron temperature $T_e$ may spike before drop to a stable level while radical density ($n_r$) and electron density ($n_e$) may increase without overshoot the stable level. This profile in FIG. 4 is only an example and in other embodiments, any parameters may behave differently (e.g., with or without overshoot). In one embodiment, the overshoot period may be assumed to be an initial 10 µs or less after $t_1$.

The stable-ON period 2 is a subsequent period during which $n_r$, $n_e$, and/or $T_e$ is considered stable, and ends at $t_2$, when the source power is turned OFF. In one embodiment, a parameter is considered stable when a rate of change in the parameter becomes less than a set threshold rate and maintained for at least a set threshold duration. In another embodiment, the beginning of the stable-ON period 2 may be determined based on the assumed duration of the overshoot period 1. In yet another embodiment, the OES methods may be used to monitor the plasma to determine the transition from the overshoot period 1 to the stable-ON period 2.

The decay period 3 is a period after $t_2$ until the beginning of a next pulse cycle (not shown in FIG. 5), during which $n_r$, $n_e$, and $T_e$ decay at substantially different rates. In one embodiment, the decay time for these parameters to drop to a negligible level may be >1 ms for $n_r$, ~100 µs for $n_e$, and ~10 µs for $T_e$. The pulsing frequency determines the duration of each pulse (i.e., the total time for the overshoot period 1, the stable-ON period, and the decay period 3). For example, according to certain embodiments, the pulsing frequency in the range of 0.1 kHz and 10 kHz will result in each pulse is between 100 µs and 10 ms. In one or more embodiments, each pulse may be between 1 ms and 100 ms (i.e., the pulsing frequency of 10 Hz to 1 kHz). Accordingly, depending on the pulsing frequency, it is possible to start the next pulse cycle before a parameter (e.g., n r or n e) decays to a negligible level.

In various embodiments, the methods of OES may be used to selectively obtain OES data for any one or more periods of interest (i.e., the overshoot period 1, the stable-ON period, or the decay period 3) to characterize the pulsed plasma with power modulation. Using the OES data collected only for a selected period of interest during power modulation, the characteristic of the pulsed plasma (e.g., plasma density) may be determined for the selected period of interest. Since OES detect optical emissions from species excited in a plasma, a window for OES data acquisition during the decay period 3 may be limited due to little to no emissions, particularly in the illustrated example in FIG. 5, where the source power is pulsed with no bias power is assumed. However, this window for OES detection during the decay period 3 may substantially be prolonged and enabled with the use of bias power that maintains certain levels of plasma heating.

It should also be noted that FIG. 5 illustrates only a portion of one pulse cycle of power modulation. In a time scale of a plasma process that is substantially longer than one pulse cycle, $n_r$, $n_e$, $T_e$, and other parameters may periodically fluctuate with pulse cycles. In certain embodiments, similar or identical temporal normalized decay profiles may be reproduced for each pulse cycle. It is still possible, however, under certain conditions that a stable plasma may not be established with power modulation, or it may take a certain induction time to establish the stable plasma. In such cases, the temporal profiles may vary from pulse to pulse. In various embodiments, selective OES data acquisition can advantageously enable a method to characterize such a stability or the lack of plasma stability for the pulsed plasma by collecting data from multiple pulse cycles.

Figure 6A:
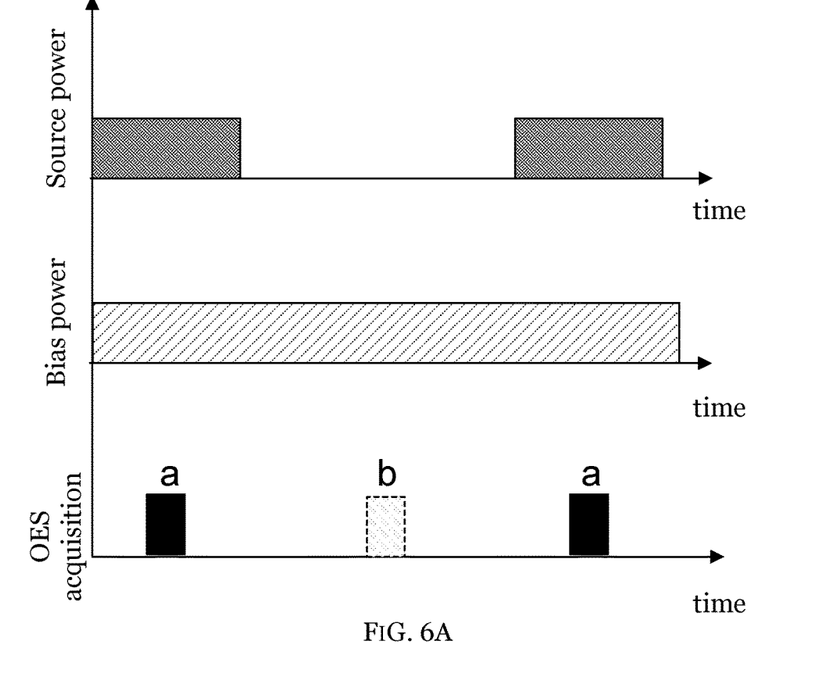
FIG. 6A illustrates an embodiment with source power pulsing.
Figure 6B:
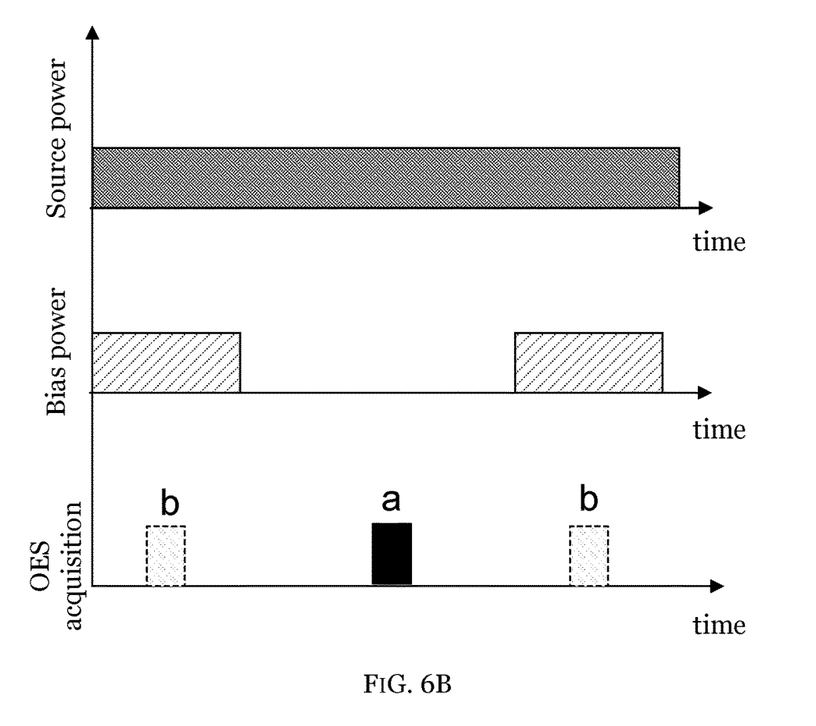
FIG. 6B illustrates an embodiment with bias power pulsing.
Figure 7A:
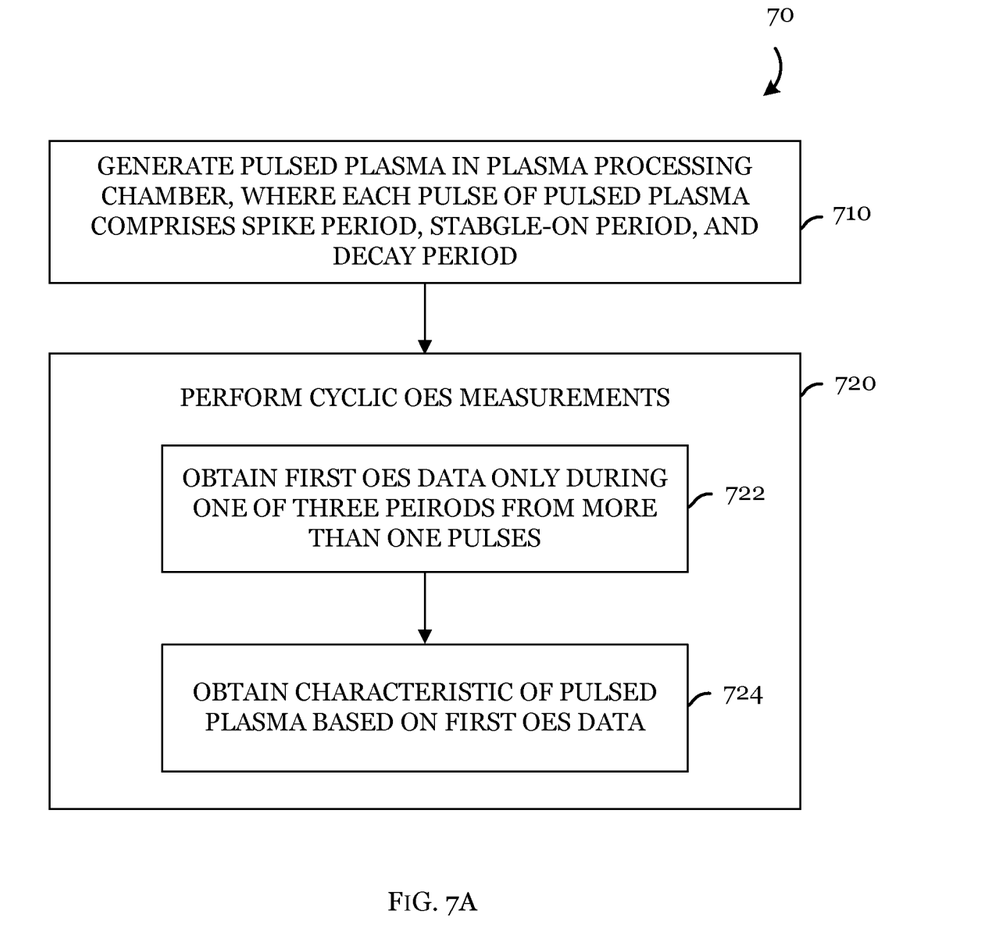
Figure 7B:
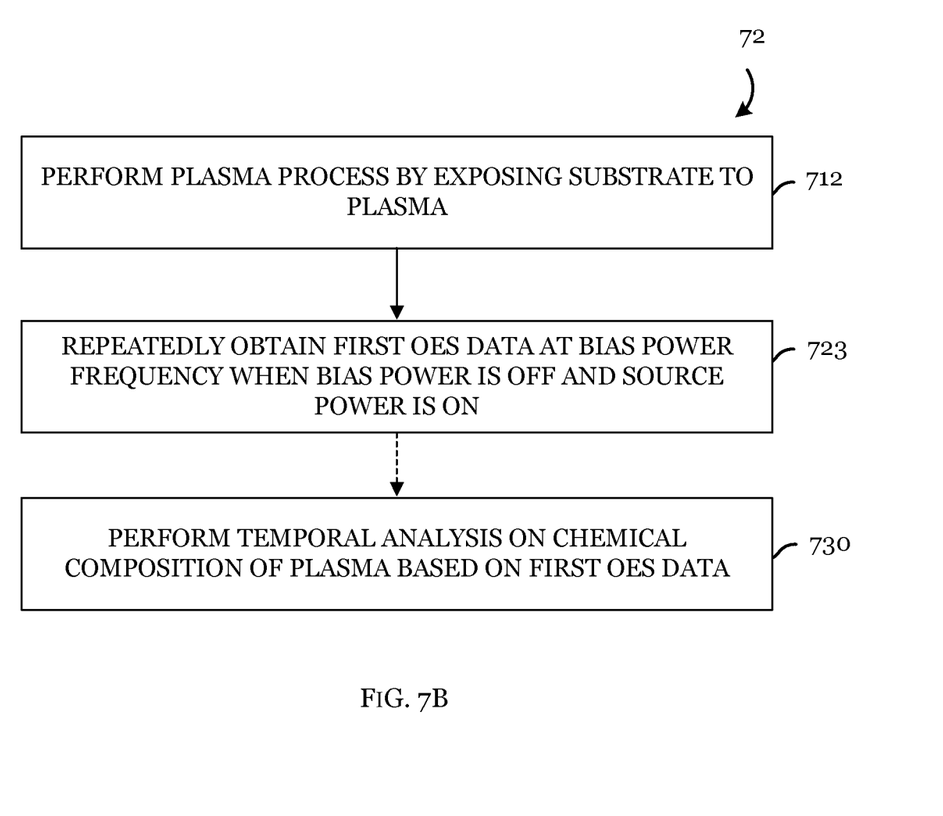
FIG. 7B illustrates another embodiment.
Figure 7C:
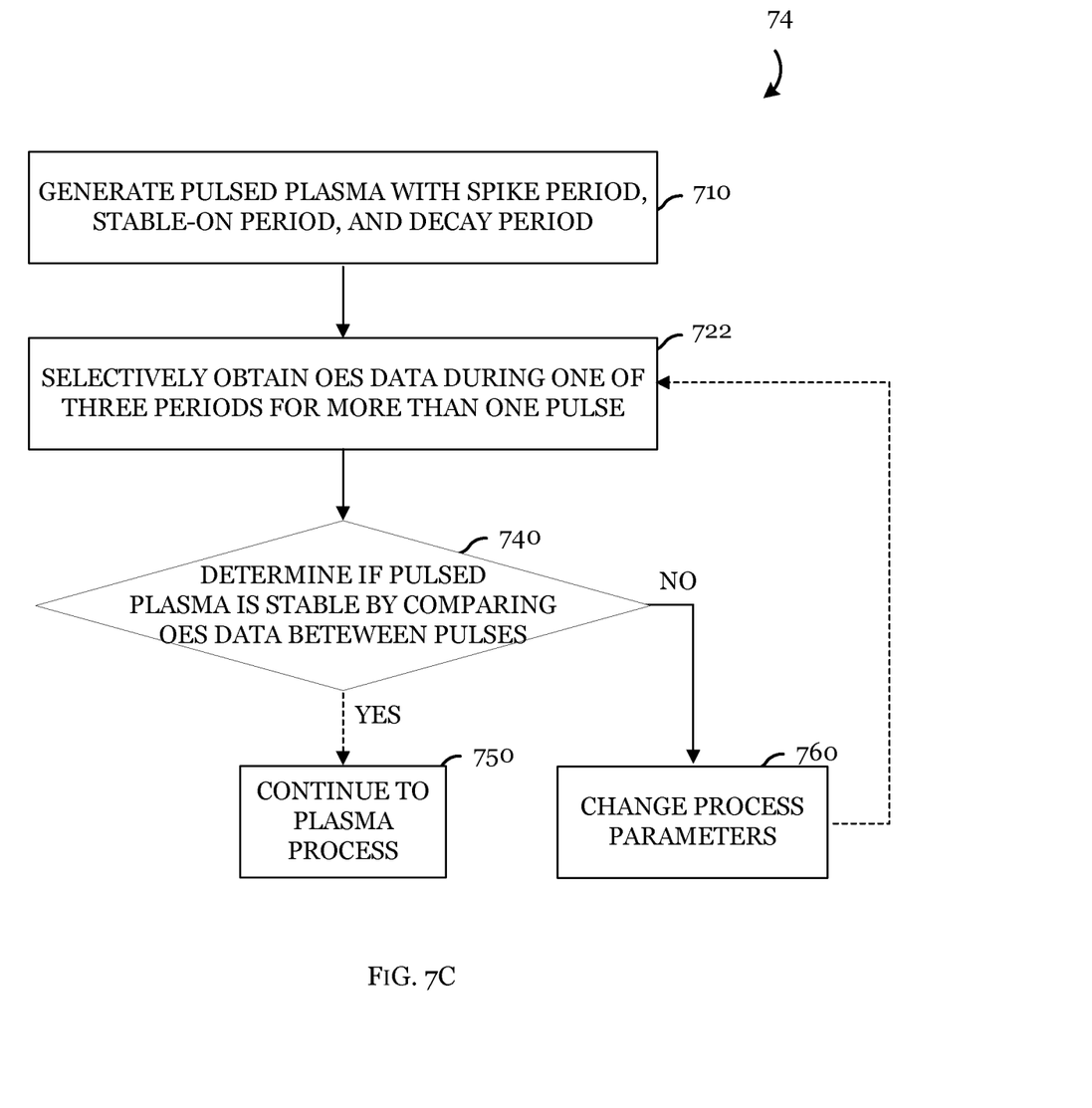
FIG. 7C illustrates an alternate embodiment.

FIG. 6A-6B illustrates example schemes for OES data acquisition synchronized with power pulsing for a pulsed plasma in accordance with various embodiments. Some exemplary embodiments for selective OES data acquisition synchronized with plasma pulsing are described. In FIG. 6A, an example time diagram for source power pulsing with selective OES data acquisition is illustrated.

In this embodiment of FIG. 6A, source power is pulsed while a continuous bias power is provided. Source power pulsing mode may advantageously allow a plasma etch process to separate gas excitation phase (source power ON) and excited species consumption phase (source power OFF). Such a separation is enabled by rapid changes of plasma parameters caused by the plasma pulsing. However, it is difficult to characterize the plasma in each phase separately with conventional OES methods such as continuous OES data acquisition. By synchronizing OES data acquisition with the plasma pulsing in accordance with various embodiments, it is possible to obtain OES data selectively to a region of interest. In the illustrated example, a first set of OES measurements (a in FIG. 6A) may be performed only during the source power ON phase. In certain embodiments, one OES measurement may take less than 10 ms, and in one or more embodiments, it may take about 4 ms. In other embodiments, time resolution in sub-milliseconds (microsecond scale) may also be achieved with an appropriate sensor. In FIG. 6A, only one OES measurement for the source power ON phase per one pulse cycle is illustrated, but more than one OES measurements may be performed. The number of OES measurements per pulse cycle may be selected based on the pulsing frequency and duty ratio. Collecting multiple OES data may be helpful in improving signal-to-noise ratio of the data through averaging, filtering, and/or smoothing. In alternate embodiments, each set of OES data for each pulse cycle may be compared to each other to determine the plasma stability over the duration of multiple plasma pulse cycles. Further, the number of OES measurements per pulse cycle may be less than 1. For example, every OES measurement may be performed for every 10 pulse cycles.

In addition, a second set of OES measurements (b in FIG. 6A) may also be performed during the source power OFF phase. The second set of OES data may be analyzed and may be used for comparison with the first set of OES data in one embodiment. Such analyses may help the understanding of the plasma characteristics with source power pulsing. For example, selective OES data acquisition for the two periods, it may quantitatively characterize the high power plasma excitation period and the low power "source power off" period. These trends may then indicate a discharge transition from high density plasma (inductively coupled) to low density plasma (capacitively coupled). Although not wishing to be limited by any theory, the OES data analyses in these embodiments may be used to provide information on a total optical emission intensity that reflects plasma density and electron temperature.

In FIG. 6B, an example time diagram for bias power pulsing with selective OES data acquisition is illustrated. In this embodiment, bias power is pulsed while a continuous source power is provided.

Bias power pulsing mode may advantageously improve by-product removal in a plasma etch process, where etching primarily occurs when the bias power is ON and by-product evacuation (removal) occurs when the bias power is OFF. In these embodiments, a first set of OES measurements may be performed when the bias power is OFF (a in FIG. 6B). Although not wishing to be limited by any theory, the OES data analyses in these embodiments may be used to provide information on specific chemical species (e.g., etch by-products). The OES selectively obtained data during the bias power OFF phase may be expected to reflect a concentration the etch by-products, which may be used to monitor the progress of by-product evacuation (removal). Based on the information obtained, the plasma etch process recipe may be updated to optimize process parameters such as pulsing frequency and duty ratio.

In addition, a second set of OES measurements (b in FIG. 6B) may also be performed during the bias power ON phase. The second set of OES data may be analyzed independently from the first set of OES data, for example, to monitor the generation of etch by-product in the plasma etch process. The first and second sets of OES data may also be compared to each other to calculate the difference in etch rate between the two periods based on the quantification of the etch by-product. In certain embodiments, the information obtained by the OES data analyses may be further used to update the process recipe and optimize the plasma etch process. For example, the OES methods herein may advantageously help reducing etch by-product dissociation and re-deposition on surface that is detrimental to effective etching.

Although one or two sets of selective OES data acquisition is described above referring to FIGS. 6A and 6B, it is also possible for the OES method to employ more than two sets in order to characterize more periods during one pulse cycle. In one embodiment, three sets of selective OES data acquisition may be performed for the overshoot period, the stable-ON period, and the decay period, as previously illustrated in FIG. 5. The OES data from the overshoot period may particularly be useful in understanding the rapid change in plasma properties during the transitory period.

As already described referring to FIG. 4, various types of pulsing schemes may be used and applied with the OES methods of this disclosure. Accordingly, each pulse cycle may comprise different temporal profiles of plasma parameters from those illustrated in FIGS. 6A and 6B. For example, both the source power and the bias power may be pulsed for a pulsed plasma (sync pulsing). In one or more embodiments, the two powers may be pulsed at a common pulsing frequency. Duty ratio for each power may be same or different. Furthermore, the source power and bias power may be off-set to each other or in complete synchronization (e.g., FIG. 3). Some examples may lead to more than three distinct periods per pulse cycle. Selective OES data acquisition of the OES methods described above can be applied to such examples as well. In one embodiment, the OES methods may be applied to study ignition instabilities unique to sync pulsing mode of pulsed plasma.

In various embodiments, the OES methods can be used as a plasma diagnostic tool to study plasma characteristics (e.g., plasma density and radical density) as a function of plasma conditions (e.g., source power, bias power, gas flow rates, pressure, and/or power modulation). As a result, the OES methods may help identifying conditions for the plasma stability for various advanced pulsing schemes. The OES methods can also be applied in a plasma process (e.g., a deposition and/or etch process) for real-time monitoring of the plasma process. Since OES can be measured as long as sufficient emissions are obtained from a plasma and the OES detection device can operate without interfering any plasma processing detection devices, the OES methods may be advantageously versatile regardless of the type of a plasma process. In one example, the OES methods may be used to determine an endpoint of a plasma etch process. Alternately, the OES methods may comprise a diagnostic step of the plasma stability prior to starting a plasma process. Selective OES data acquisition and subsequent analysis may be formed to determine the pulsed plasma is stable for at least a certain duration of time beyond one pulse cycle. The plasma process may start if the pulsed plasma is determined stable (e.g., FIG. 7C).

FIG. 7A-7C illustrates process flow charts of methods of characterizing a pulsed plasma with OES in accordance with various embodiments.

In FIG. 7A, a process flow 70 starts with generating a pulsed plasma in a plasma processing chamber (block 710). In various embodiments, each pulse of the pulsed plasma comprises three periods: a overshoot period, a stable-ON period, and a decay period. Next, cyclic optical emission spectroscopy (OES) measurements may be performed for the pulsed plasma using an OES system of the plasma processing system (block 720). The cyclic OES measurements may comprise obtaining first OES data during one of the three periods from more than one pulses of the pulsed plasma (block 722) and obtaining a characteristic of the pulsed plasma during the one of the three periods based only on the first OES data (block 724). The characteristic of the pulsed plasma that may be derived from the first OES data may include plasma density, radical density, and concentrations of species of interest.

In FIG. 7B, a process flow 72 starts with performing a plasma process on a substrate in a plasma processing chamber by exposing the substrate to a pulsed plasma in the plasma processing chamber, where the pulsed plasma is provided with a source power and a pulsed bias power at a bias power frequency (block 712). Subsequently, first OES data may be repeatedly obtained at the bias power frequency when the bias power is OFF and the source power is ON (block 723). In various embodiments, the bias power frequency may be between 0.1 kHz and 100 kHz. In certain embodiments, the process may further proceed to performing a temporal analysis on chemical composition of the pulsed plasma based on the first OES data (block 730).

In FIG. 7C, a process flow 74 starts with generating a pulsed plasma process in a plasma processing chamber according to initial conditions of process parameters by providing a source power and a bias power, where the source power or the bias power is pulsed (block 710). In various embodiments, each pulse of the pulsed plasma comprises three periods: a overshoot period, a stable-ON period, and a decay period. Next, OES data may be obtained during one of the three periods from more than one pulses of the pulsed plasma (block 722). The process then proceeds to determining if the pulsed plasma is stable by comparing the OES data between pulses of the pulsed plasma (block 740). If the pulsed plasma is determined not stable, then one or more process parameters may be changed from the initial conditions of process parameters (block 760). In certain embodiments, after changing one or more process parameters, the step of selectively obtaining OES data (block 722) and the step of determining (block 740) may be repeated until the pulsed plasma is determined stable. If the pulsed plasma is determined stable, in certain embodiments, a plasma process may be performed by exposing a substrate in the plasma processing chamber to the pulsed plasma (block 750).

Example embodiments of the invention are summarized here. Other embodiments can also be understood from the entirety of the specification as well as the claims filed herein.

Example 1. A method of characterizing a plasma in a plasma processing system that includes: generating a pulsed plasma in a plasma processing chamber of the plasma processing system, the pulsed plasma being powered with a pulsed power signal, each pulse of the pulsed plasma including three periods: a overshoot period, a stable-ON period, and a decay period; performing cyclic optical emission spectroscopy (OES) measurements for the pulsed plasma, the cyclic OES measurements including: obtaining first OES data during one of the three periods from more than one pulses of the pulsed plasma; and obtaining a characteristic of the pulsed plasma for the one of the three periods based only on the first OES data.

Example 2. The method of example 1, where the pulsed power signal is for source power or bias power, and is pulsed at a frequency between 0.1 kHz and 100 kHz.

Example 3. The method of one of examples 1 or 2, where a measurement for one of the first plurality of OES data takes less than 100 ms.

Example 4. The method of one of examples 1 to 3, where the first OES data is collected during the overshoot period, the cyclic OES measurements further including: obtaining second OES data during the stable-ON periods or the decay periods from more than one pulses of the pulsed plasma; and obtaining a characteristic of the pulsed plasma for the stable-ON periods or the decay periods based only on the second OES data.

Example 5. The method of one of examples 1 to 3, where the first OES data is collected during the stable-ON period, the cyclic OES measurements further including: obtaining second OES data during the decay periods from more than one pulses of the pulsed plasma; and obtaining a characteristic of the pulsed plasma for the decay periods based only on the second OES data.

Example 6. The method of one of examples 1 to 5, where the characteristic of the pulsed plasma includes plasma density.

Example 7. A method of processing a substrate that includes: performing a plasma process on a substrate in a plasma processing chamber by exposing the substrate to a pulsed plasma in the plasma processing chamber, the pulsed plasma being provided with a source power and a pulsed bias power at a bias power frequency; and repeatedly obtaining first optical emission spectroscopy (OES) data when the bias power is OFF and the source power is provided, where the first OES data being obtained at the bias power frequency.

Example 8. The method of example 7, where the bias power frequency is between 0.1 kHz and 100 kHz.

Example 9. The method of one of examples 7 or 8, where each of the first OES data is obtained by an OES measurement of less than 100 ms.

Example 10. The method of one of examples 7 to 9, further including performing a temporal analysis on chemical composition of the pulsed plasma based on the first OES data.

Example 11. The method of one of examples 7 to 10, where obtaining the first OES data and the temporal analysis are performed while performing the plasma process.

Example 12. The method of one of examples 7 to 11, where the plasma process is a plasma etch process and the temporal analysis on chemical composition includes monitoring an etch by-product.

Example 13. The method of one of examples 7 to 12, further including repeatedly obtaining second OES data when the bias power is ON, where the second OES date being obtained at the bias power frequency.

Example 14. The method of one of examples 7 to 13, where the source power is a pulsed source power at a source power modulation frequency, further including repeatedly obtaining third OES data when the source power is ON, where the third OES data being obtained at the source power frequency.

Example 15. An optical emission spectroscopy (OES) apparatus including: a plasma processing chamber configured to hold a substrate to be processed; a RF power source configured to generate a pulsed plasma in the plasma processing chamber; an OES detection device connected to the plasma processing chamber, the OES detection device being configured to measure OES signals from the pulsed plasma; a microprocessor; and a non-transitory memory storing a program to be executed in the microprocessor, the program including instructions to: generate a first pulse train and a second pulse train, the first pulse train and the second pulse train being synchronized; power the RF power source and generate the pulsed plasma based on the first pulse train; and collect a set of OES data at the OES detection device based on the second pulse train.

Example 16. The OES apparatus of claim 15, where the two pulse trains are configured such that the set of OES data are collected only when the RF power is ON.

Example 17. The OES apparatus of one of examples 15, where the two pulse trains are configured such that the set of OES data are collected only when the RF power is OFF.

Example 18. The OES apparatus of one of examples 15 to 17, the program further including an instruction to perform a temporal analysis of the pulsed plasma based on the set of OES data.

Example 19. The OES apparatus of one of examples 15 to 18, the program including further instructions to: determine if the pulsed plasma is stable based on the temporal analysis; if the pulsed plasma is determined not stable, update the first pulse train and the second train; power the RF power source based on the updated first pulse train; and collect another set of OES data at the OES detection device based on the updated second pulse train.

Example 20. The OES apparatus of one of examples 15 to 19, where the OES detection device has a time resolution for detection of less than 100 ms.

Example 21. A method of characterizing a plasma in a plasma processing system that includes: generating a pulsed plasma process in a plasma processing chamber according to initial conditions of process parameters, the pulsed plasma being provided with a source power and a bias power, the source power or the bias power being pulsed, each pulse of the pulsed plasma including three periods: a overshoot period, a stable-ON period, and a decay period; selectively obtaining OES data during one of the three periods from more than one pulses of the pulsed plasma; and determining if the pulsed plasma is stable by comparing the OES data between pulses of the pulsed plasma; and if the pulsed plasma is determined not stable, changing one or more process parameters from the initial conditions of process parameters.

Example 22. The method of examples 21, further including, after changing one or more process parameters, repeating the step of selectively obtaining OES data and the step of determining until the pulsed plasma is determined stable.

Example 23. The method of one of examples 21 to 22, further including, after the pulsed plasma is determined stable, performing a plasma process by exposing a substrate in the plasma processing chamber to the pulsed plasma.

Example 24. The method of one of examples 5 to 6, the cyclic OES measurements further including: selectively obtaining third OES data during the overshoot periods from more than one pulses of the pulsed plasma; and obtaining a characteristic of the pulsed plasma during the overshoot periods based on the third OES data.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of characterizing a plasma in a plasma processing system, the method comprising:
generating a pulsed plasma in a plasma processing chamber of the plasma processing system, the pulsed plasma being powered with a pulsed power signal, each pulse of the pulsed plasma comprising three periods: an overshoot period, a stable-ON period, and a decay period;
performing cyclic optical emission spectroscopy (OES) measurements for the pulsed plasma, the cyclic OES measurements comprising:
obtaining first OES data during one of the three periods from more than one pulses of the pulsed plasma; and
obtaining a characteristic of the pulsed plasma for the one of the three periods based only on the first OES data.

2. The method of claim 1, wherein the pulsed power signal is for source power or bias power, and is pulsed at a frequency between 0.1 kHz and 100 kHz.

3. The method of claim 1, wherein a measurement for the first OES data takes less than 100 ms.

4. The method of claim 1, wherein the first OES data is collected during the overshoot period, the cyclic OES measurements further comprising:
obtaining second OES data during the stable-ON periods or the decay periods from more than one pulses of the pulsed plasma; and
obtaining a characteristic of the pulsed plasma for the stable-ON periods or the decay periods based only on the second OES data.

5. The method of claim 1, wherein the first OES data is collected during the stable-ON period, the cyclic OES measurements further comprising:
obtaining second OES data during the decay periods from more than one pulses of the pulsed plasma; and
obtaining a characteristic of the pulsed plasma for the decay periods based only on the second OES data.

6. The method of claim 1, wherein the characteristic of the pulsed plasma comprises plasma density.

7. A method of processing a substrate, the method comprising:
performing a plasma process on a substrate in a plasma processing chamber by exposing the substrate to a pulsed plasma in the plasma processing chamber, the pulsed plasma being provided with a source power and a pulsed bias power at a bias power frequency; and
repeatedly obtaining first optical emission spectroscopy (OES) data when the bias power is OFF and the source power is provided, the first OES data being obtained at the bias power frequency.

8. The method of claim 7, wherein the bias power frequency is between 0.1 kHz and 100 kHz.

9. The method of claim 7, wherein each of the first OES data is obtained by an OES measurement of less than 100 ms.

10. The method of claim 7, further comprising performing a temporal analysis on chemical composition of the pulsed plasma based on the first OES data.

11. The method of claim 10, wherein obtaining the first OES data and the temporal analysis are performed while performing the plasma process.

12. The method of claim 10, wherein the plasma process is a plasma etch process and the temporal analysis on chemical composition comprises monitoring an etch by-product.

13. The method of claim 7, further comprising repeatedly obtaining second OES data when the bias power is ON, wherein the second OES data is obtained at the bias power frequency.

14. The method of claim 7, wherein the source power is a pulsed source power at a source power modulation frequency, further comprising repeatedly obtaining third OES data when the source power is ON, wherein the third OES data are obtained at the source power modulation frequency.

15. An optical emission spectroscopy (OES) apparatus comprising:
a plasma processing chamber configured to hold a substrate to be processed;

a RF power source configured to generate a pulsed plasma in the plasma processing chamber;

an OES detection device connected to the plasma processing chamber, the OES detection device being configured to measure OES signals from the pulsed plasma;

a microprocessor; and a non-transitory memory storing a program to be executed in the microprocessor, the program comprising instructions to:

generate a first pulse train and a second pulse train, the first pulse train and the second pulse train being synchronized;

power the RF power source and generate the pulsed plasma based on the first pulse train; and collect a set of OES data at the OES detection device based on the second pulse train.

16. The OES apparatus of claim 15, wherein the first and the second pulse trains are configured such that the set of OES data are collected only when the RF power is ON.

17. The OES apparatus of claim 15, wherein the first and the second pulse trains are configured such that the set of OES data are collected only when the RF power is OFF.

18. The OES apparatus of claim 15, the program further comprising an instruction to perform a temporal analysis of the pulsed plasma based on the set of OES data.

19. The OES apparatus of claim 18, the program comprising further instructions to:

determine if the pulsed plasma is stable based on the temporal analysis;

if the pulsed plasma is determined not stable, update the first pulse train and the second pulse train;

power the RF power source based on the updated first pulse train; and collect another set of OES data at the OES detection device based on the updated second pulse train.

20. The OES apparatus of claim 18, wherein the OES detection device has a time resolution for detection of less than 100 ms.

* * * * *